(12) United States Patent
Ostapenko

(10) Patent No.: US 6,413,789 B2
(45) Date of Patent: Jul. 2, 2002

(54) METHOD OF DETECTING AND MONITORING STRESSES IN A SEMICONDUCTOR WAFER

(75) Inventor: Sergei Ostapenko, Wesley Chapel, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 09/767,980

(22) Filed: Jan. 23, 2001

Related U.S. Application Data

(60) Provisional application No. 60/177,898, filed on Jan. 24, 2000.

(51) Int. Cl.[7] .................................................. H01L 21/66
(52) U.S. Cl. ............................ 438/14; 438/50; 438/53; 600/459
(58) Field of Search ............................ 438/14, 15, 16, 438/50, 53; 600/459, 460; 606/1; 257/64

(56) References Cited

U.S. PATENT DOCUMENTS

| | | | | |
|---|---|---|---|---|
| 4,128,011 A | | 12/1978 | Savage | 73/579 |
| 5,517,037 A | * | 5/1996 | Yamamoto | 257/64 |
| 5,728,089 A | * | 3/1998 | Lal et al. | 606/1 |
| 5,972,782 A | | 10/1999 | Ostapenko | 438/488 |
| 6,087,652 A | * | 7/2000 | O'Meara et al. | 250/214.1 |
| 6,328,696 B1 | * | 12/2001 | Fraser | 600/459 |
| 6,328,697 B1 | * | 12/2001 | Fraser | 600/459 |
| 2001/0046720 A1 | * | 11/2001 | Ostapenko | 438/14 |
| 2002/0017834 A1 | * | 2/2002 | MacDonald | 310/328 |

* cited by examiner

Primary Examiner—John F. Niebling
Assistant Examiner—Olivia T Luk
(74) Attorney, Agent, or Firm—Howard & Howard

(57) ABSTRACT

A method of detecting and monitoring elastic strains in a semiconductor wafer (12) comprising the steps of coupling the wafer (12) to a transducer (10) having a periphery (11). This is followed by operating the transducer (10) to produce ultrasonic vibrations at a predetermined wavelength $\lambda$ and propagating a standing wave through the wafer (12) in response to the ultrasonic vibrations. The method is characterized by extending the wafer (12) in a cantilevered section L from the periphery (11) of the transducer (10) to a distal end (13), and measuring the amplitude of the standing wave $\lambda$ in the cantilevered section L. For maximum efficiency, the cantilevered section L is substantially one quarter of the predetermined wavelength ($\lambda/4$).

8 Claims, 8 Drawing Sheets

METHOD OF DETECTING AND MONITORING STRESSES IN A SEMICONDUCTOR WAFER

RELATED APPLICATION

This application claims the benefit of prior provisional application Serial No. 60/177,898 filed Jan. 24, 2000.

BACKGROUND OF THE INVENTION

1. Technical Field

The subject invention relates to a method of non-contact detection and monitoring of elastic stresses in a semiconductor wafer.

2. Description of the Prior Art

Semiconductor wafers are subjected to internal and external stresses during growth and processing. Internal stresses are generated by crystal defects, such as dislocations, precipitates, and point defect agglomerates. External stresses are created after the wafer undergoes thin-film deposition and thermal annealing. The thin-film deposition adds a film layer of material to the wafer. Then as the wafer undergoes thermal processing, if the film and the wafer have different rates of thermal expansion, the external stress may be formed. These stresses cause premature and uncontrollable breakage of the wafers and the failure of manufactured devices.

In the U.S. Pat. No. 5,972,782, issued Oct. 26, 1999 to the inventor named herein, there is disclosed a method of ultrasound treatment (UST) of hydrogenerated poly-Si film on transistors. The ultrasound enhanced hydrogenation is disclosed therein as UST stimulated release of atomic hydrogen from the electrically nonactive state (H-reservoir) followed by subsequent hydrogen trapping at dangling Si bonds in grain boundary regions and surface interfaces. As disclosed in this prior patent, sandwiching a wafer with a transducer adjacent an acoustic wave detector carries out the method.

SUMMARY OF THE INVENTION AND ADVANTAGES

The subject invention provides an enhanced method of inducing, detecting and monitoring of elastic stresses in a semiconductor wafer by allowing the wafer to freely respond to the induced vibrations.

The invention presents a method of detecting and monitoring elastic strains in a semiconductor wafer, said method comprising the steps of coupling the wafer to a transducer having a periphery, operating the transducer to produce ultrasonic vibrations at a predetermined wave length, and propagating a standing wave through the wafer in response to the ultrasonic vibrations. The method is characterized by extending the wafer in a cantilevered section from the periphery of the transducer to a distal end, and measuring the amplitude of the standing wave in the cantilevered section.

As the wafer extends in a cantilevered section from the periphery of the transducer, the cantilevered section is free to vibrate unimpeded by the transducer thereby to produce a more accurate evaluation of the residual strains in transistor wafers.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE PREFERRED EMBODIMENT

Figure 1:
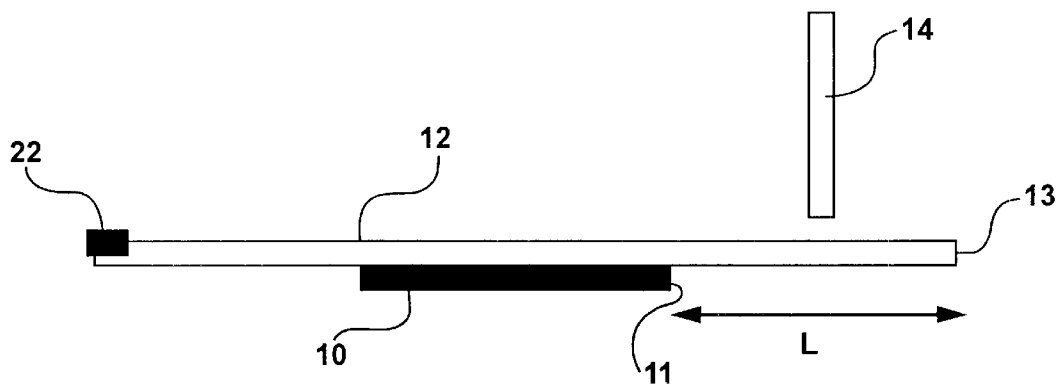
FIG. 1 is a schematic view of a system for stress monitoring in semiconductor wafers.

Referring to the Figures, wherein like numerals indicate like or corresponding parts throughout the several views, a transducer 10 for generating ultrasonic vibrations is shown in FIG. 1.

The transducer 10 is driven by a programmable function generator (not shown) and a power amplifier (not shown). The transducer 10 is preferably a resonance piezoelectric transducer generating ultrasonic vibrations. The transducer 10 is coupled to or sandwiched with the backside of a wafer 12. The wafer 12 is of any material known in the art of semiconductors, e.g., Cz-Si. The wafer 12 can be manufactured with a notch 22 which is used for orientation during testing. The wafer 12 and the transducer 10 are both circular in configuration. Therefore, the transducer 10 has a periphery 11. The wafer 12 has a length L that extends past the radius of the transducer 10 to a distal end or edge 13. The transducer 10 operates at a selected frequency and amplitude, which generates standing waves in the wafer 12. An acoustic probe 14 is positioned near the front surface of the wafer 12 either having a physical contact with wafer or preferable without such a contact to monitor and detect the ultrasonic vibrations of the wafer 12 and send an electric signal to a lockin amplifier (not shown) which measures the amplitude of these ultrasonic vibrations. The lockin amplifier can measure harmonic vibrations of the wafer 12, which have the same frequency as the transducer 10. Alternatively, the lockin amplifier can be tuned to measure super-harmonic vibrations of the wafer 12 with frequency above the frequency of the transducer 10 or sub-harmonic vibrations of a wafer 12 with frequency below that of the transducer. The properties of the ultrasonic vibrations are then plotted to determine any strains that may be present in the wafer.

Figure 2:
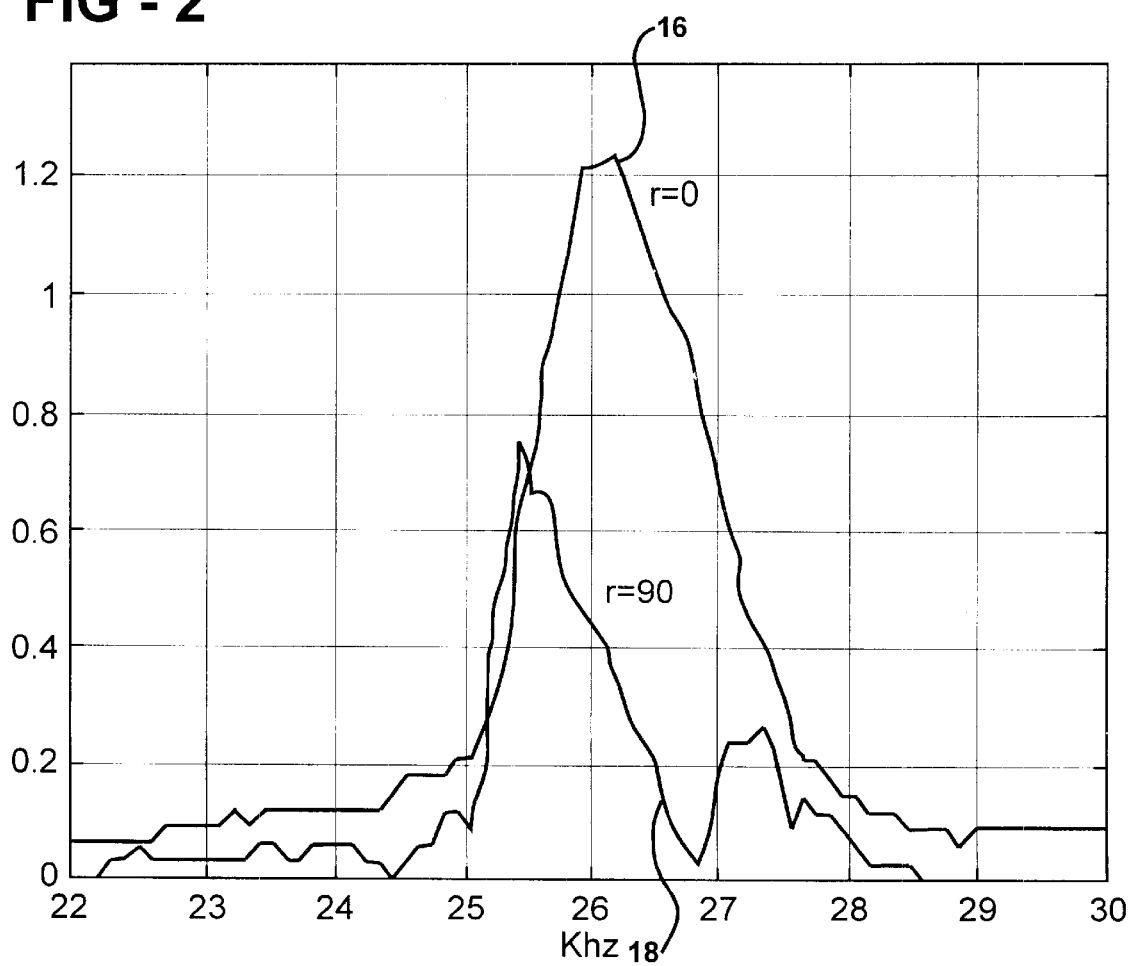
FIG. 2 is a graphical illustration of a frequency scan for a bare wafer at its center and its edge.

FIG. 2 shows a plot, known as frequency scans, of the amplitude of the standing wave on the y-axis versus frequency of the transducer on the x-axis. The first line 16 is the data collection of the probe 14 being positioned over the center of the wafer 12. The first line 16 resembles the resonance curve (not shown) of the transducer 10 without the wafer 12. A second line 18 shows the output when the probe is positioned at an edge of the wafer 12. The maximum amplitude of the wave has shifted to the lower frequency due to the extra loading mass of the wafer 12. FIG. 2 shows that only selected frequencies can approach the edge of the wafer and form the standing wave.

Figure 3:
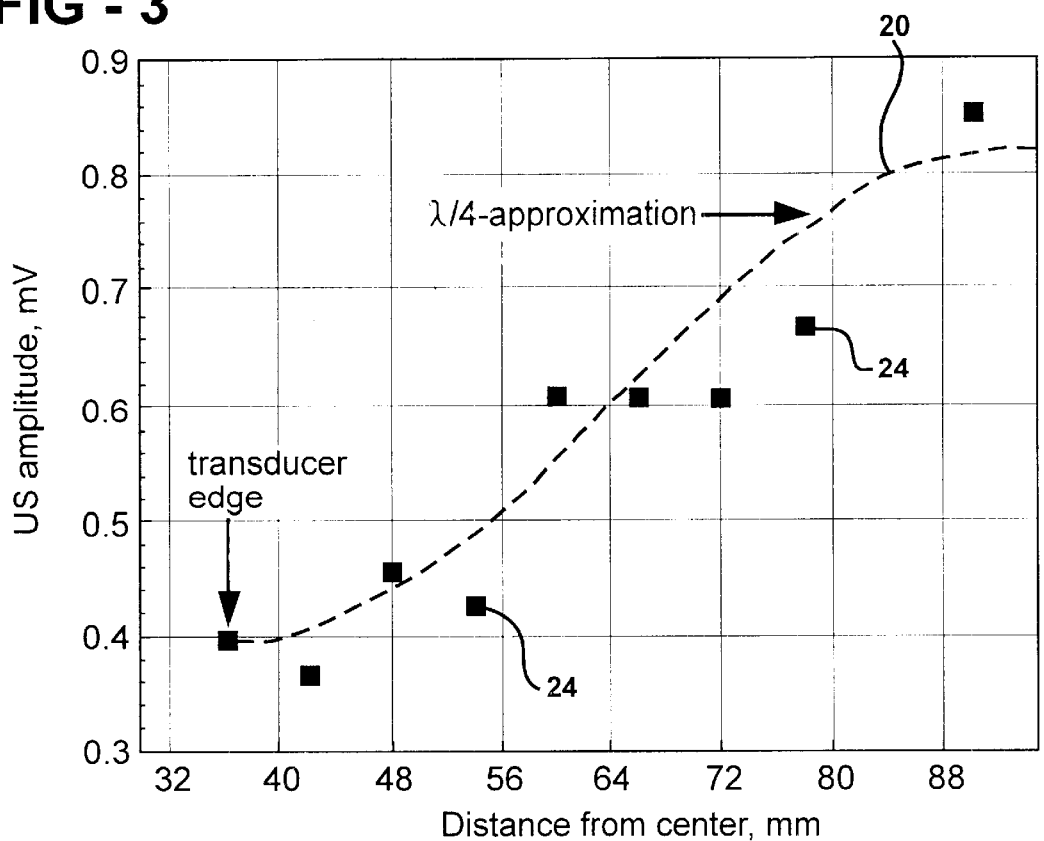
FIG. 3 is a radial distribution of the ultrasonic amplitude from a transducer edge to the wafer's periphery as a probe is moved across the wafer and theoretical approximation.

FIG. 3 illustrates the distribution of the amplitude of the wave as the probe 14 was moved from the edge of the transducer towards the edge of the wafer. The signal detected by the probe 14 is plotted as a plurality of points 24. The points 24 should resemble a curve 20 of the wavelength divided by four. The wavelength divided by four should approximately equal the length L of the wafer from the edge of the transducer to the edge of the wafer.

Figure 4A:
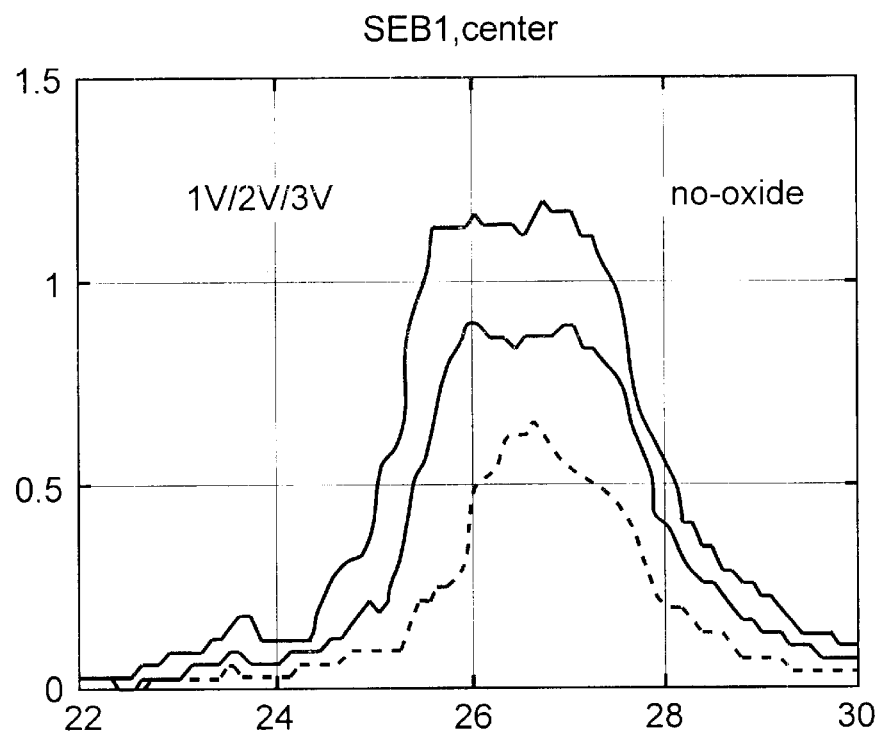
FIG. 4 is a graphical illustration of acoustic amplitude versus frequency at three different voltages for a bare wafer measured at its center.
Figure 4B:
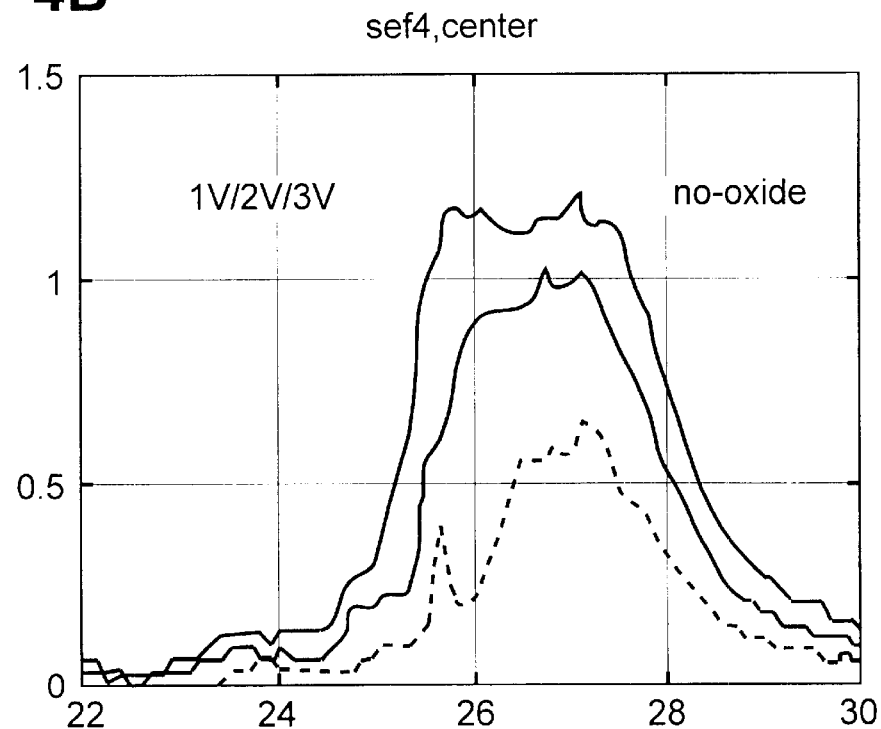
Figure 5A:
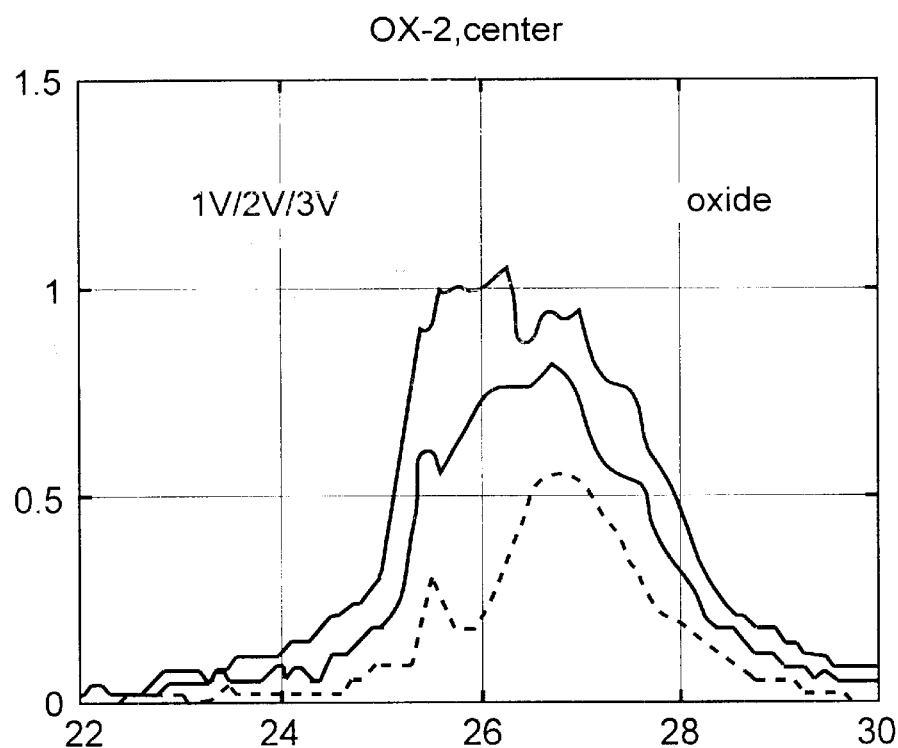
FIG. 5 is a graphical illustration of acoustic amplitude versus frequency at three different voltages for a wafer with oxide measured at its center.
Figure 5B:
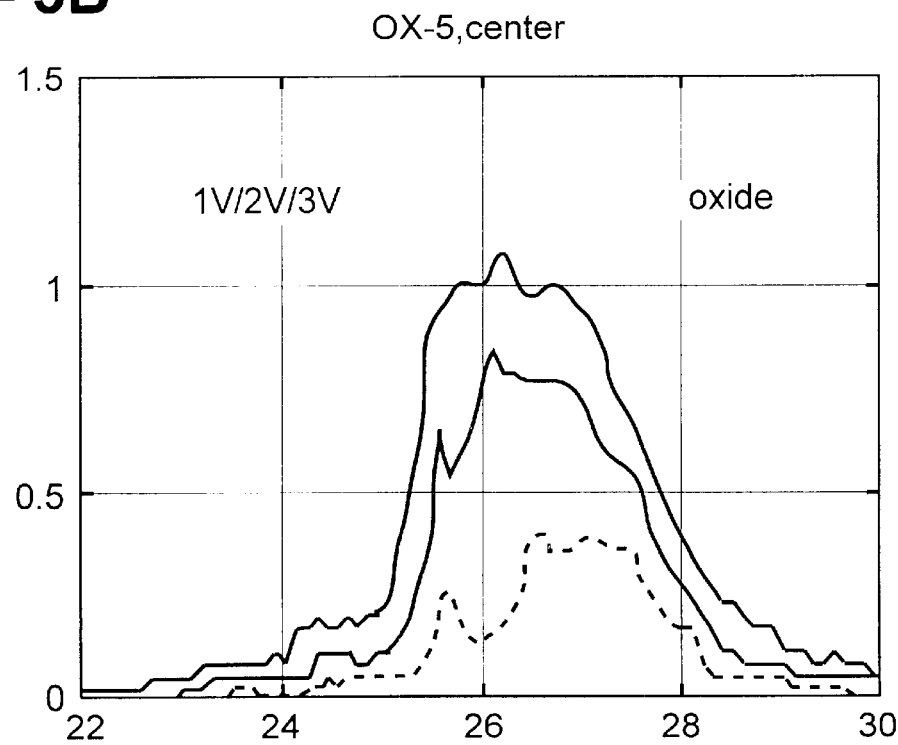

FIG. 4 and FIG. 5 are frequency scans of four different 8" wafers. FIG. 4 shows results for two wafers which are bare and have no film, while FIG. 5 shows two other wafers which have a deposited thermal oxide. In FIGS. 4 and 5, each wafer was tested with the transducer 10 operating at voltages of one, two and three volts. Also, the frequency scans in FIG. 4 and FIG. 5 were produced with the probe 14 at the center of the wafer 12. The frequency scans of each wafer measured at the center were very similar to each other.

Figure 6A:
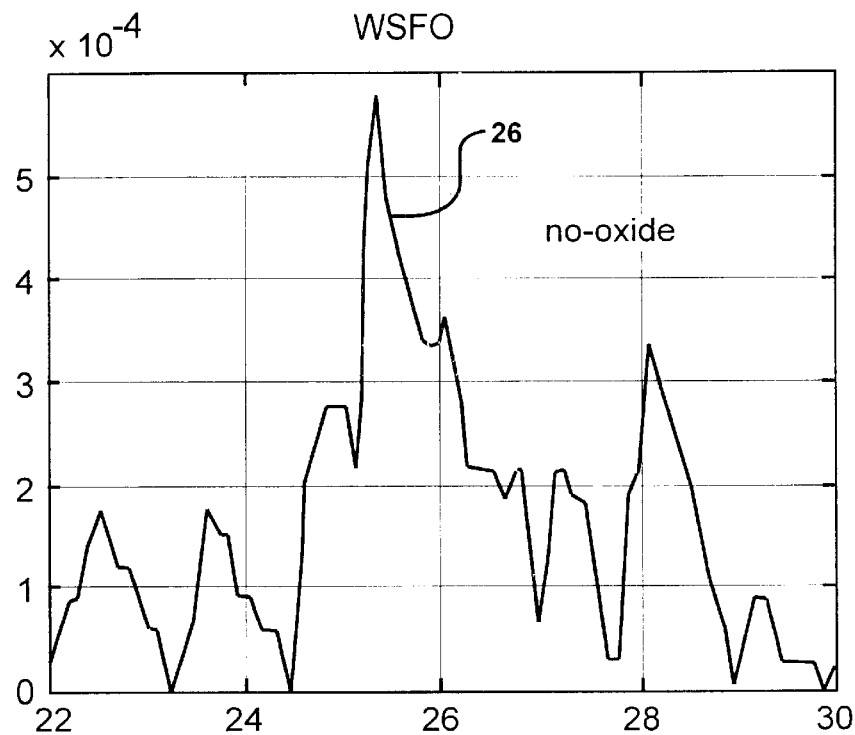
FIG. 6 is a graphical illustration of acoustic amplitude versus frequency for a bare wafer measured at its edge.
Figure 6B:
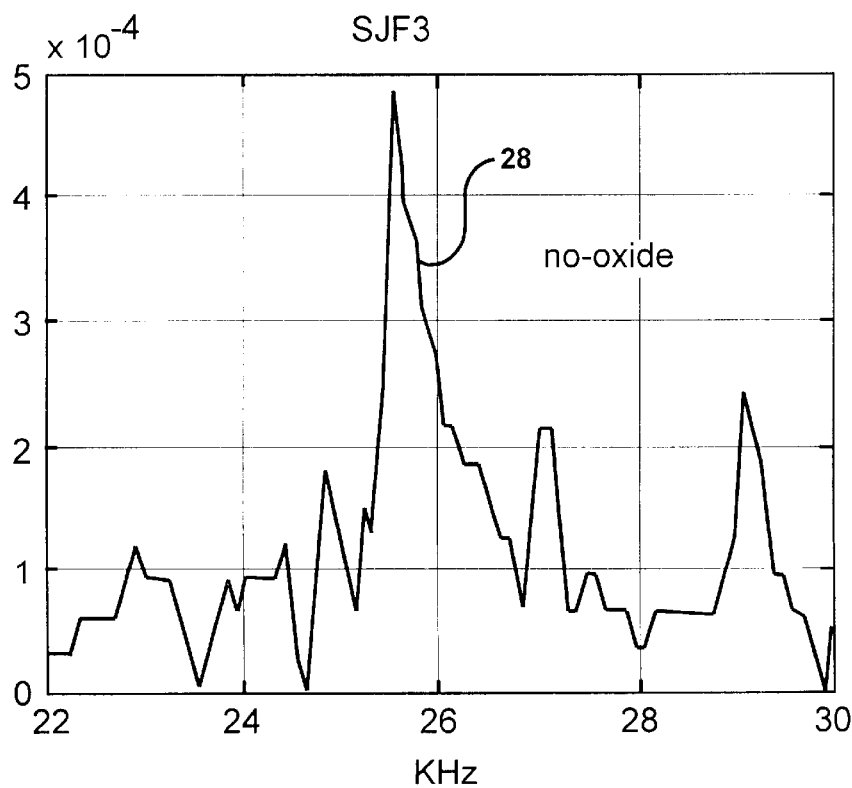
Figure 7A:
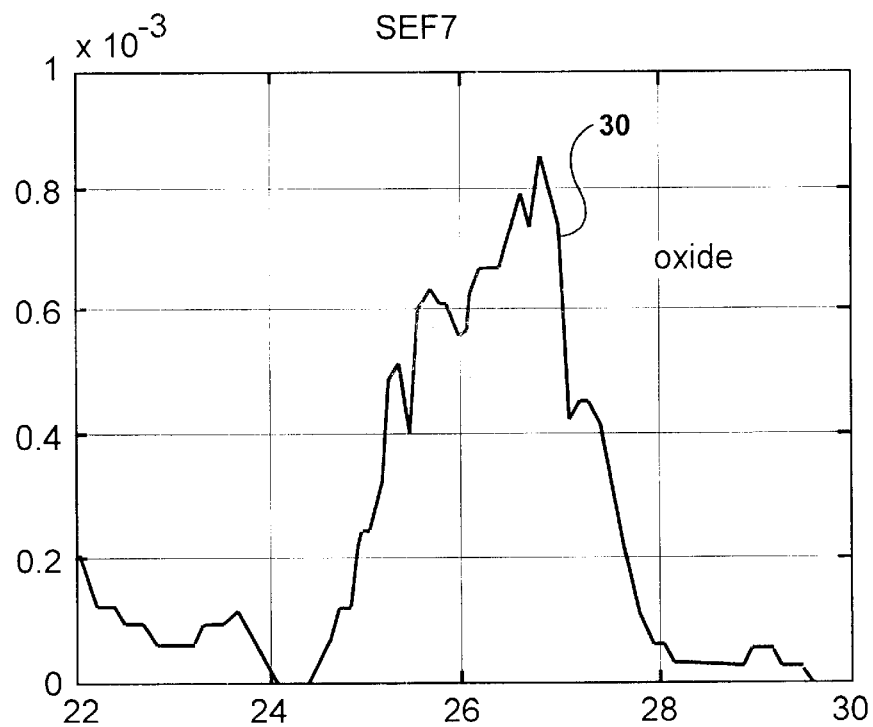
FIG. 7 is a graphical illustration of acoustic amplitude versus frequency for a wafer with oxide measured at its edge.
Figure 7B:
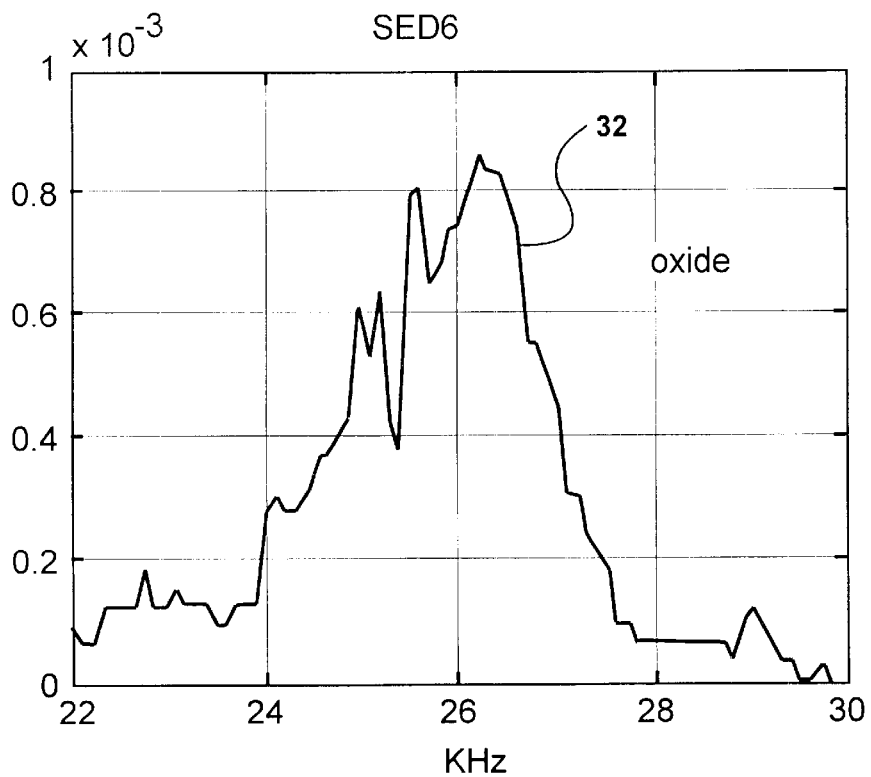
Figure 8A:
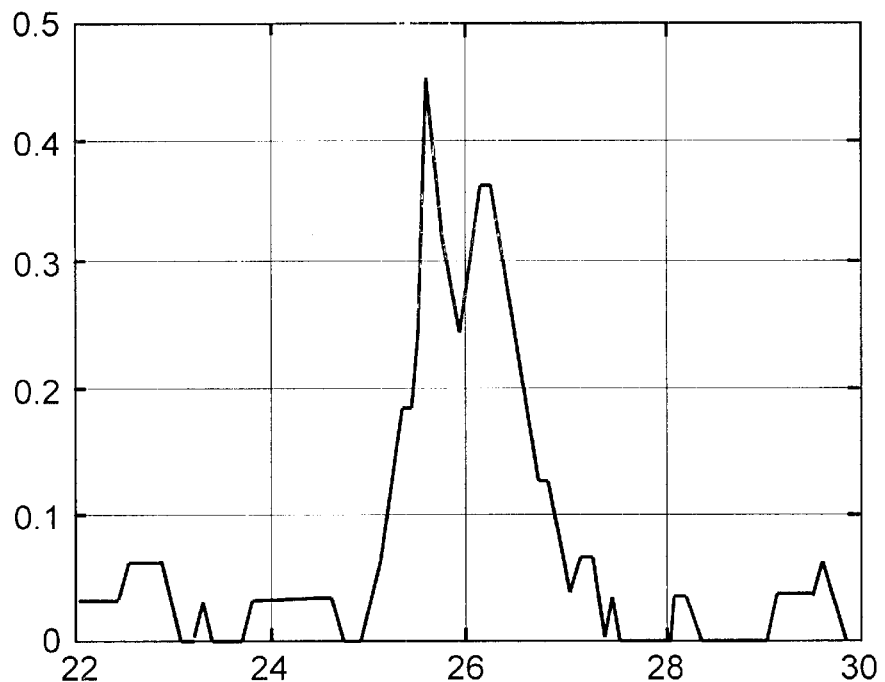
FIG. 8 is a graphical illustration of four frequency scans of four bare wafers that were modified during their growth.
Figure 8B:
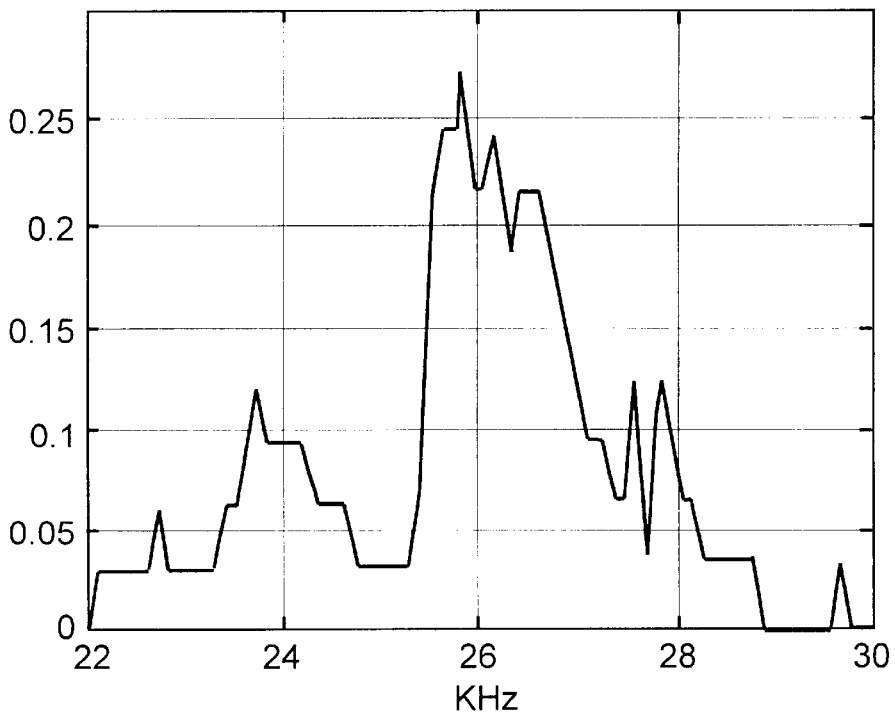
Figure 8C:
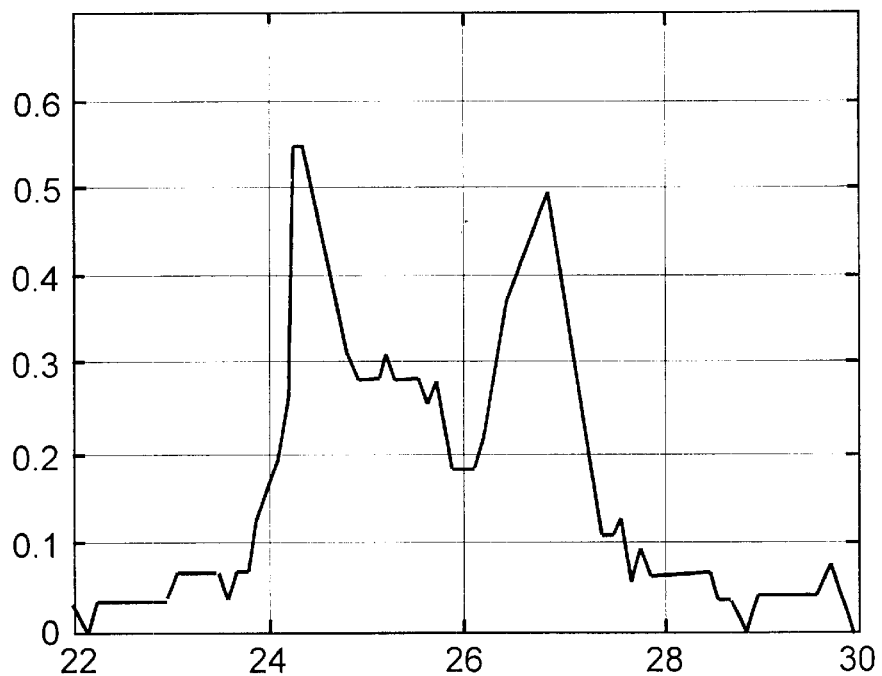
Figure 8D:
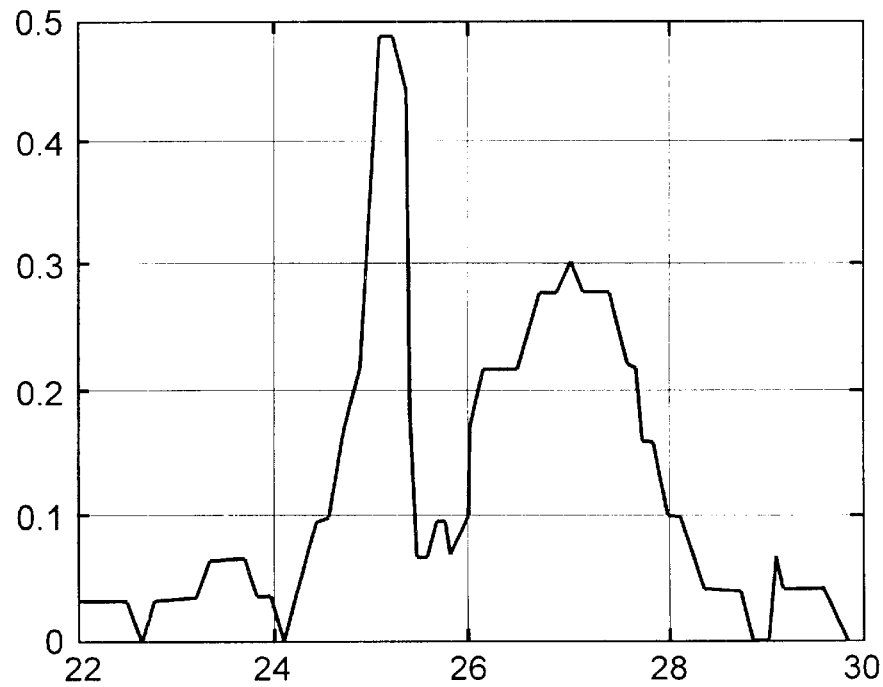

FIG. 6 and FIG. 7 show the results of the same wafers as FIGS. 4 and 5, but the results were obtained with the probe 14 near the edge of the wafer 12. The frequency scans of the bare wafers, shown in FIG. 6, have a narrow peak 26, 28 of about 0.6 to 1.0 kHz. Any additional resonances or peaks for bare wafers can be an indication of internal strains which lead to a variation of the wafer's elastic constants. This result is similar to the frequency scans obtained in FIG. 2. As FIG. 7 shows, the wafers with deposited thermal oxides have much broader peaks 30, 32 of about 2.25 to 2.4 kHz. The change in the size of the peak can be attributed to the change of the elastic modulus of the wafer with oxide and strains in the wafer and thin film.

FIG. 8 shows frequency scans for four other wafers without oxide which were stressed during growth, cutting and annealing. The resulting graphs show a similar broadening and transformation of the frequency scans.

Figure 9:
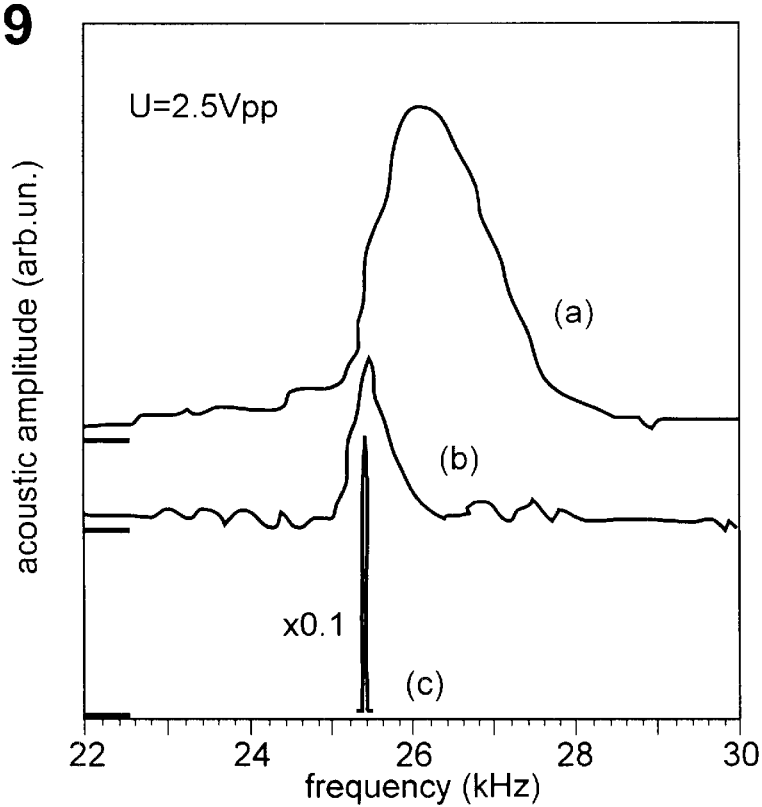
FIG. 9 is a graphical illustration of three frequency scans of a bare wafer measured in the harmonic mode at the center and the periphery of the wafer.

FIG. 9 shows three frequency scans in the harmonic mode of a bare wafer with a diameter of 200 mm at the center (a), and at periphery (b). Curve (c) shows the amplitude of the sub-harmonic vibrations of the same wafer measured at ½ frequency of the transducer's frequency when the acoustic probe 14 is located at the wafer's periphery. The frequency curve (c) is much narrower than the ones for the harmonic mode, like curve (b). This sub-harmonic resonance can be also used for the purpose of stress control in semiconductor wafers.

In current method, the ultrasonic vibrations are propagated in Cz-Si beyond the transducer and form standing waves at specific frequencies. The amplitude of a standing wave can be measured using a non-contact acoustic probe positioned and moved above a surface of the wafer (see FIG. 1). The highest sensitivity to wafer vibrations will be achieved when a free edge of the wafer, L, is close to ¼ wavelength of the elastic vibrations.

EXAMPLE

Cz-Si: 196 mm diameter, (100) plane. Transducer: PZT-5H piezoceramics, 74 mm diameter, f=–25 KHz main resonance frequency of radial vibrations. Share waves propagating along <110> direction in Si with displacement parallel to (100) plane have velocity, $v_s$=5.84e+5 cm/sec. This is transferred to wavelength $\lambda = v_s/f = 23.36$ cm or $\lambda/4 =$ 5.84 cm. The free edge or distal end 13 of the wafer 12 in this geometry has L=6.1 cm close to $\lambda/4$ of the share resonance vibrations. The difference can be adjusted by changing radius of the transducer.

The method of non-contact measuring of f-scans in Cz-Si wafers is sensitive to (1) stresses due to a thin film deposition, and (2) residual stress in silicon due to process defects. The method can be scaled up and adopted to wafers with different diameters including a 12" Cz-Si.

Accordingly, the subject invention provides a method of detecting and monitoring elastic strains in a semiconductor wafer comprising the steps of coupling the wafer 12 to a transducer 10 having a periphery 11. This is followed by operating the transducer 10 to produce ultrasonic vibrations at a predetermined wavelength $\lambda$ and propagating a standing wave through the wafer 12 in response to the ultrasonic vibrations. The method is characterized by extending the wafer 12 in a cantilevered section L from the periphery 11 of the transducer 10 to a distal end 13, and measuring the amplitude of the standing wave $\lambda$ in the cantilevered section L. For maximum efficiency, the cantilevered section L is substantially one quarter of the predetermined wavelength ($\lambda/4$).

As alluded to above, the wafer 12 and the transducer 10 are circular with the wafer 12 having a larger radius than the transducer 10. The radius of the wafer 12 is one quarter of the predetermined wavelength ($\lambda/4$) larger than the radius of the transducer 10. In order to perfect the efficiency, the measuring of the amplitude of the standing wave is at the distal end 13 of the wafer 12. Alternatively, the amplitude of the standing wave is measured at a plurality of positions along the cantilevered section L between the periphery 11 of the transducer 10 and the distal end 13 of the wafer 12.

As will be appreciated, the method includes the step of plotting and analyzing data of the measurements for different wafers to determine wafer strains. This is accomplished preferably by positioning an acoustic probe 14 in spaced relationship to the cantilevered section L of the wafer 12.

The invention has been described in an illustrative manner, and it is to be understood that the terminology that has been used is intended to be in the nature of words of description rather than of limitation. It is now apparent to those skilled in the art that many modifications and variations of the present invention are possible in light of the above teachings. It is, therefore, to be understood that the invention may be practiced otherwise than as specifically described.

What is claimed is:

1. A method of detecting and monitoring elastic strains in a semiconductor wafer, said method comprising the steps of;

coupling the wafer to a transducer having a periphery, operating the transducer to produce ultrasonic vibrations at a predetermined wavelength, propagating a standing wave through the wafer in response to the ultrasonic vibrations, said method characterized by extending the wafer in a cantilevered section from the periphery of the transducer to a distal end, and measuring the amplitude of the standing wave in the cantilevered section.

2. A method as set forth in claim 1 wherein said cantilevered section is substantially one quarter of the predetermined wavelength.

3. A method as set forth in claim 1 wherein said wafer and said transducer are circular with said wafer having a larger radius than said transducer.

4. A method as set forth in claim 3 wherein the radius of the wafer is one quarter of the predetermined wavelength larger than the radius of the transducer.

5. A method as set forth in claim 1 wherein the measuring of the amplitude of the standing wave is at the distal end of the wafer.

6. A method as set forth in claim 1 wherein the amplitude of the standing wave is measured at a plurality of positions along the cantilevered section between the periphery of the transducer and the distal end of the wafer.

7. A method as set forth in claim 6 including plotting and analyzing data of the measurements for different wafers to determine wafer strains.

8. A method as set forth in claim 1 wherein the measuring is further defined as positioning an acoustic probe in spaced relationship to the wafer.

* * * * *